(12) United States Patent
Lin

(10) Patent No.: US 9,076,943 B2
(45) Date of Patent: Jul. 7, 2015

(54) LEAD FRAME STRUCTURE, A PACKAGING STRUCTURE AND A LIGHTING UNIT THEREOF

(75) Inventor: Chen-Hsiu Lin, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 891 days.

(21) Appl. No.: 13/106,975

(22) Filed: May 13, 2011

(65) Prior Publication Data

US 2012/0074451 A1    Mar. 29, 2012

(30) Foreign Application Priority Data

Sep. 27, 2010   (TW) ................................ 99218586 U

(51) Int. Cl.
- *H01L 23/495* (2006.01)
- *H01L 33/62* (2010.01)
- *H01L 33/64* (2010.01)

(52) U.S. Cl.
CPC ............... *H01L 33/62* (2013.01); *H01L 33/642* (2013.01); *H01L 2224/48091* (2013.01); *H01L 2224/48247* (2013.01); *H01L 2933/0066* (2013.01)

(58) Field of Classification Search
CPC .............. H01L 23/49541; H01L 2224/4903; H01L 23/4951; H01L 2924/1815; H01L 23/49861; H01L 21/4832; H01L 2224/49051; H01L 23/49555; H01L 2225/1029; H01L 23/4334; H01L 23/49517; H01L 23/49537
USPC ......... 257/666, 668, 678, 690, 692, 734, 736, 257/E23.031, E23.043, E23.046, E23.05, 257/E23.06; 438/121, 123, FOR. 366, 438/FOR. 377, FOR. 380; 174/529, 530, 174/531, 536, 50; 29/827, 855, 856; 428/572; 216/14

See application file for complete search history.

(56) References Cited

U.S. PATENT DOCUMENTS

| | | | |
|---|---|---|---|
| 6,307,272 B1 * | 10/2001 | Takahashi et al. ............. | 257/787 |
| 6,858,919 B2 * | 2/2005 | Seo et al. ....................... | 257/666 |
| 8,422,243 B2 * | 4/2013 | Chow et al. .................... | 361/760 |
| 8,729,681 B2 * | 5/2014 | Lin et al. ........................ | 257/667 |
| 2008/0054421 A1 * | 3/2008 | Dimaano et al. ............... | 257/676 |
| 2010/0102348 A1 * | 4/2010 | Lin ................................. | 257/98 |
| 2010/0123156 A1 * | 5/2010 | Seo et al. ........................ | 257/99 |

* cited by examiner

*Primary Examiner* — Meiya Li
(74) *Attorney, Agent, or Firm* — Li&Cai Intellectual Property (USA) Office

(57) ABSTRACT

A lead frame structure, a packaging structure and a lighting unit are disclosed. The lead frame structure includes at least two first lead frame units having a space therebetween, and the two first lead frame units are arranged in an opposite manner. Each the first lead frame unit has a first conducting portion, a second conducting portion, and a first connection portion between the first and the second conducting portions. Moreover, the first connection portion has at least two grooves on a surface thereof.

22 Claims, 8 Drawing Sheets

US 9,076,943 B2

LEAD FRAME STRUCTURE, A PACKAGING STRUCTURE AND A LIGHTING UNIT THEREOF

BACKGROUND OF THE INVENTION

1. Field of the Invention

The present invention is a lead frame structure, a packaging structure and a lighting unit having an identification structure; especially, the present invention relates to a lead frame structure, a packaging structure and a lighting unit having a difference in appearance and reducing the moisture attack.

2. Description of Related Art

The traditional lighting emitting diode package is formed by packaging the housing and the lead frames. However, the two kinds of materials, i.e., the housing is plastic and the lead frames are metallic, have weak strength when assembling thereof. As a result, the housing may be easily peeled off from the lead frames, or there may be a space formed between the housing and any one of the lead frames. Environment moisture can enter into the housing through the space to "attack" the circuit of the lighting emitting diode chip and the lead frames inside the housing. Therefore, the reliability and the stability of the traditional lighting product are bad.

On the other hand, the traditional lead frames have the identical structure and cannot be identified the polarity of the lead frames in appearance. The operators have to check the polarities of the lead frames and the corresponding polarities of lighting emitting diode chip before the step of mounting the lighting emitting diode chip on the lead frame. However, it is easy to mount the lighting emitting diode chip on the wrong side of the lead frames and the manufacturing yield is low. In addition, it is necessary to inspect the manufactured products in many inspection methods. Thus, the manufacturing efficiency of the product cannot be improved.

SUMMARY OF THE INVENTION

The objective of the present invention is to provide a lead frame structure, a packaging structure and a lighting unit, which can reduce the moisture attack. The lead frame structure can further used to increase the combination strength between the lead frame and the housing. Thus, the reliability and the stability of product are improved.

Another objective of the present invention is to provide a lead frame structure, a packaging structure and a lighting unit, in characterized that one of the lead frame structure has an identification structure so that the lead frame units of the lead frame structure, the packaging structure and the lighting unit have a difference in appearance for improve the manufacturing efficiency. Furthermore, the mistakes of mounting the lighting device on the lead frame unit with wrong polarity can be avoided.

By the at least two grooves formed on the first connection portion, the moisture attack can be reduced so as to protect the lighting device inside the housing.

DETAILED DESCRIPTION OF THE PREFERRED EMBODIMENTS

The present invention provides a lead frame structure for a semiconductor device, a packaging structure and a lighting unit. The lead frame structure can be used to prevent the LED chip from the moisture and further to improve the combinability of the lead frame structure and the housing of the lighting unit.

Figure 1:
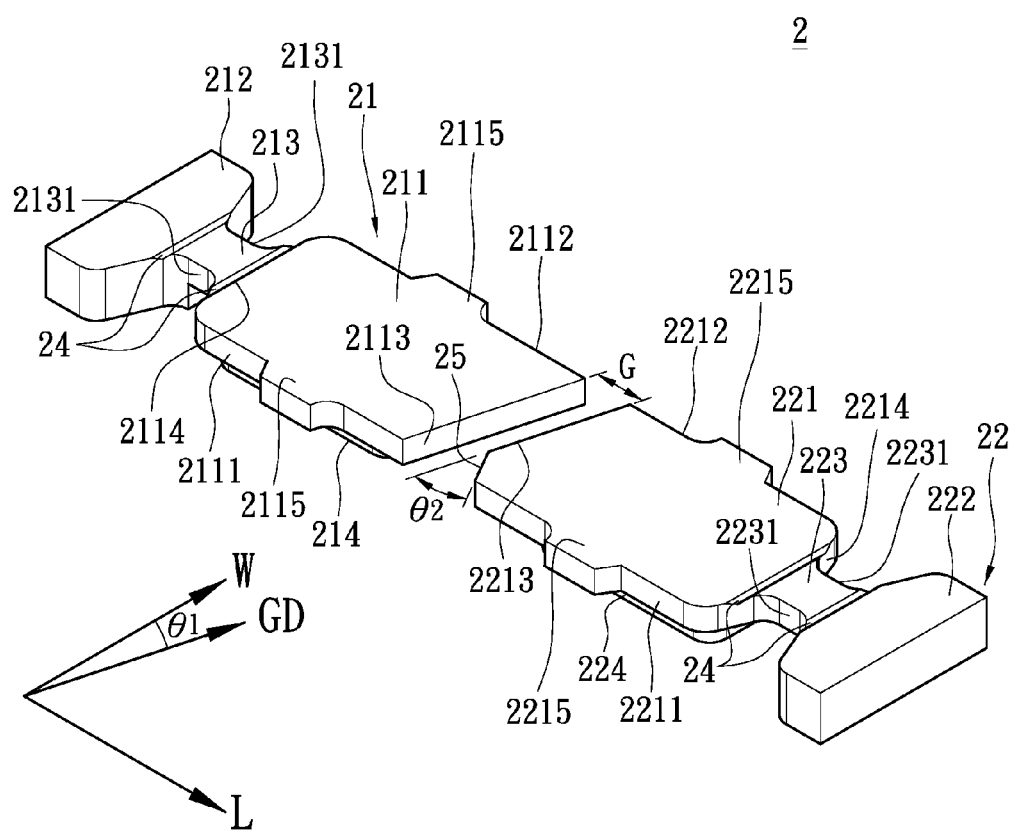
FIG. 1 is a top-view structural diagram of the first embodiment of the lead frame structure according to the present invention.

Please refer to FIG. 1, in which the top-view structural diagram of the lead frame structure 2 of the first embodiment is shown. The lead frame structure 2 has two first lead frame units 21, 22 and there is a gap G between the two first lead frame units 21, 22. The two first lead frame units 21, 22 are arranged in an opposite manner, i.e., the arranging direction of the two first lead frame units 21, 22 are opposite. The first lead frame unit 21 has a first conducting portion 211, a second conducting portion 212, and a first connection portion 213 between the first and the second conducting portions 211, 212. Similarly, the first lead frame unit 22 has a first conducting portion 221, a second conducting portion 222, and a first connection portion 223 between the first and the second conducting portions 221, 222. Moreover, the first connection portion 213 (223) has at least two grooves 24 on a surface thereof. In the exemplary embodiment, the first lead frame unit 21 (22) has two grooves 24. One groove 24 is formed on the connection position of the first conducting portion 211 (221) and the first connection portion 213 (223), and the other groove 24 is formed on the connection position of the second conducting portion 212 (222) and the first connection portion 213 (223).

For the purpose of clear description, the positions of the first conducting portion 211, 221 and the second conducting portion 212, 222 are applied to define a first direction L, also called as the longitudinal direction. The first conducting portion 211 (221) has a first side 2111 (2211), a second side 2112 (2212), a third side 2113 (2213) and a fourth side 2114 (2214). The first side 2111 (2211) and the second side 2112 (2212) extends along the first direction L; in other words, the arrangement of the first side 2111 (2211) and the second side 2112 (2212) are along the first direction L. A second direction GD is defined as a direction non-parallel to the first direction L and the second direction GD can also be called as a direction of the gap G Further, a third direction W is defined. The third direction W is also non-parallel to the first direction L and called as a transverse direction. In the exemplary embodiment, an included angle θ1 is defined between the second direction GD and the third direction W. The included angle θ1 can be ranged in 0 (zero) –30 degrees, and preferably, 15-20 degrees. The first conducting portions 211, 221 can have larger area for wire-bonding when the included angle θ1 has a large value. The extension direction of the third side 2113 (2213) is parallel to the second direction GD. The third side 2113 of the first lead frame unit 21 and the third side 2213 of the first lead frame unit 22 are spaced by the gap G. The fourth side 2114 (2214) corresponds to the third side 2113 (2213) and is located away from the gap G Furthermore, the fourth side 2114 (2214) is extending along the third direction W; therefore, the extension direction of the fourth side 2114 (2214) is not parallel to the extension direction of the third side 2113 (2213).

On the other hand, the first conducting portion 211 of the first lead frame unit 21 has a first protruding body 214 integrally on a bottom thereof so that the first conducting portion 211 can be a carrier with step-shaped structures therearound. In other words, the first conducting portion 211 and the first protruding body 214 are constructed as a structure having step-shaped structure around the edge. As a result, the contact area of the longitudinal direction between the plastic material (e.g., the housing) and the first lead frame unit 21 (22) is increased so as to improve the combination strength between the plastic material and the first lead frame unit 21 (22).

The first conducting portion 211 of the first lead frame unit 21 has two protruding portions 2115 which are respectively formed on the first side 2111 and the second side 2112 of the first conducting portion 211. The protruding portions 2115 are protruded along the third direction W and toward the opposite directions. The protruding portions 2115 are used to increase the contact area and attaching area between the plastic material and metal (i.e., the first lead frame unit 21, 22) so as to highly improve the combination strength between the injected plastic material and the first lead frame unit 21 (22).

In the exemplary embodiment, the first connection portion 213 of the first lead frame unit 21 is extending from the fourth side 2114 along the first direction L. The first connection portion 213 connects between the first conducting portion 211 and the second conducting portion 212 of the same first lead frame unit 21, and the width of the first connection portion 213 is smaller than the width of the first conducting portion 211 and the width of the second conducting portion 212. In other words, the first connection portion 213 forms a necking portion between the first conducting portion 211 and the second conducting portion 212. For example, the first conducting portion 211 and the second conducting portion 212 have an equal width e.g., W1 and W2 as shown in FIG. 2B. The width W3 of the first connection portion 213 is determined by the following formula: W3/W1=½-¼, preferably, W3/W1=⅓. Thus, the first and the second conducting portions 211, 212 and the first connection portion 213 construct as a fishtail-shaped structure. As a result, while injecting the plastic material, the plastic material is filled into the mold (not shown) and the space defined by the fourth side 2114, the first connection portion 213 and the second conducting portion 212. Therefore, the formed plastic material and the metal (i.e., the first lead frame unit 21) can have a blending structure for increasing the combination strength of the plastic material and the metal. Moreover, the fishtail-shaped structure can solve the short-shot problem in the injection process. On the other hand, the first connection portion 213 has two sides 2131 respectively extended from the first side 2111 and the second side 2112 smoothly along the first direction L. The sides 2131 are preferably arc-shaped, e.g., no angle formed thereon for the purpose that the flowing plastic material can cover the entire surface of the sides 2131. Thus, there is no unfilled area formed between the plastic material and the metal, and the combinability of the first lead frame unit 21 and the plastic material can be improved.

As well as the first lead frame unit 21, the first lead frame unit 22 has first protruding body 224, the protruding portions 2115, the first connection portion 223 which can be referenced as the foregoing description of the first lead frame unit 21.

In addition, one of the first lead frame units 21, 22 has an identification structure 25 thereon for differing and identifying the two first lead frame units 21, 22 in appearance. The first lead frame units 21, 22 are pre-determined the polarity (i.e, negative or positive) thereof and the wire-bonding step can be progressed depending on the polarity of the first lead frame units 21, 22. In the exemplary embodiment, the identification structure 25 is formed on the first lead frame unit 22. Specifically, the first conducting portion 221 of the first lead frame unit 22 has the identification structure 25 on the third side 2213, and the identification structure 25 is adjacent to the gap G The third side 2213 is cut to form a chamfering, and an included angle θ2 is defined between the chamfering and the second direction GD. The included angle θ2 is ranged from about 40 to 50 degrees, preferably about 45 degrees for differing the first lead frame units 21, 22. In other words, one of the first lead frame units 21, 22 has an identification structure 25, such as the above-mentioned chamfering, color, shape, or pattern. The identification structure 25 helps users to identify the first lead frame units 21, 22 in appearance. Furthermore, the mold or tool for manufacturing lighting unit can be designed according to the identification structure 25 and so that the effect of mistake proofing (i.e., Poka-yoke) is achieved.

Figure 2A:
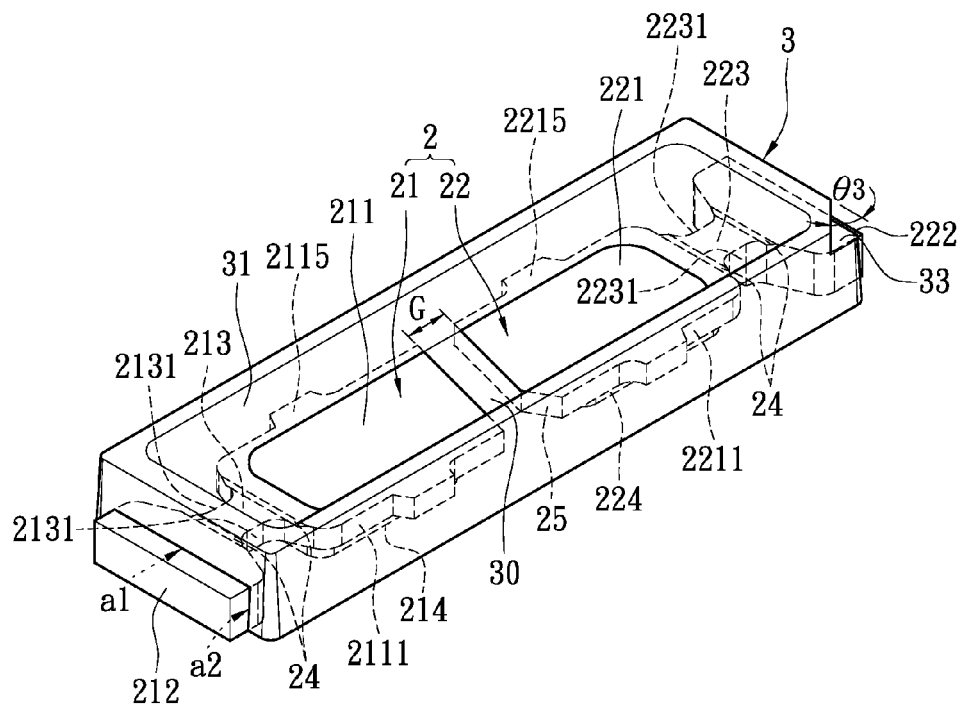
FIG. 2A is a perspective diagram of the first embodiment of the packaging structure according to the present invention.
Figure 2B:
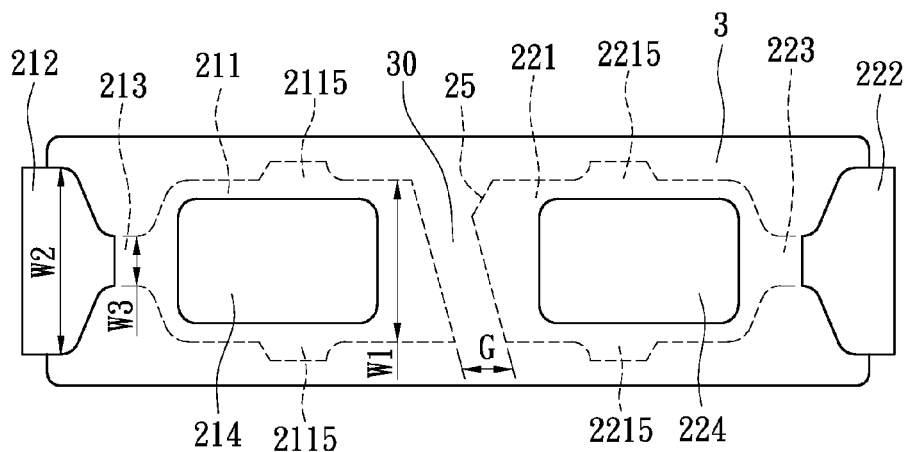
FIG. 2B is a bottom-view diagram of the first embodiment of the packaging structure according to the present invention.

FIGS. 2A and 2B are respectively showing the perspective view and the bottom view of the packaging structure formed by covering the plastic material onto the lead frame structure 2. The first lead frame units 21, 22 are carried in the mold in an opposite manner, e.g., the first conducting portions 211, 221 are close to each other and the second conducting portions 212, 222 are away from each other. The plastic material is injected into the mold to cover the lead frame structure 2 and then the plastic material is cured to form a housing 3 thereon. The second conducting portions 212, 222 are partially exposed from the housing 3, and the first conducting portions 211, 221 and the first connection portions 213,223 are disposed in the housing 3.

The housing 3 has a division 30 which is formed by filling the plastic material into the gap G and curing the plastic material. In other words, the division 30 is formed between the first lead frame units 21, 22 and separating the first lead frame units 21, 22 from each other. Moreover, the first protruding body 214 (224) has a surface exposed from a bottom surface of the housing 3, and the surface of the first protruding body 214 (224) and the bottom surface of the housing 3 form a coplanar surface. The housing 3 further has an auxiliary identification structure 33. For example, the auxiliary identification structure 33 can be a tri-angle chamfering structure on a corner of the housing 3, but the shape of the chamfering structure is not restricted thereby. An included angle θ3 is defined between the auxiliary identification structure 33 and the third direction W. Please note that the position of the auxiliary identification structure 33 can be corresponding to the position of the identification structure 25. According to the auxiliary identification structure 33, the operator or manufacturing tool can recognize the polarity of the first lead frame units 21, 22 to prevent the assembly mistake and to improve the manufacturing yield.

Figure 3:
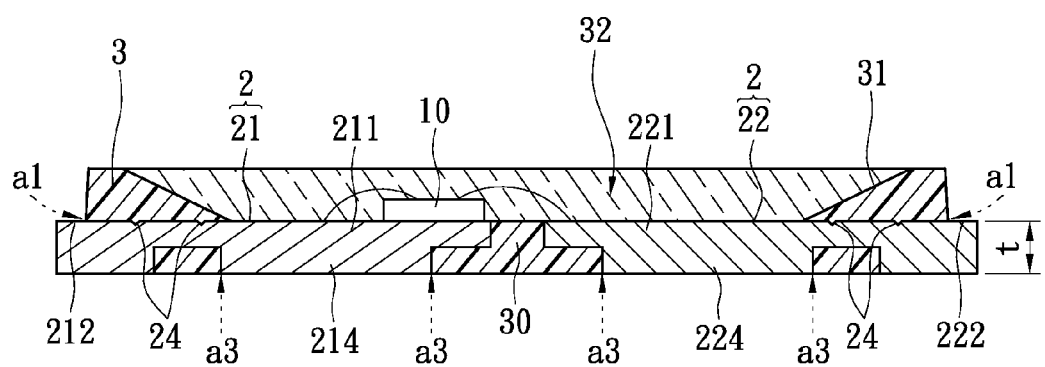
FIG. 3 is a cut-view diagram of the first embodiment of the lighting unit according to the present invention.

The housing 3 can have at least one concave portion 31. The first conducting portions 211, 221 can be partially exposed from the housing 3 through the concave portion 31. A lighting device 10 can be electrically disposed on one of the first lead frame units 21, 22 to form a light unit as shown in FIG. 3. Specifically, the lighting device, such as LEDs, is mounted on the exposed area of one of the first conducting portions 211, 221 in the concave portion 31. The mounted lighting device 10 can electrically connected to the first conducting portions 211, 221 by wire bonding, and the second conducting portions 212, 222 are connected to a power supply for electrically powering the lighting device 10 to generate light. Typically, the concave portion 31 may be served as the light projecting surface or the light projecting area.

Taking the first lead frame unit 21 as an Example, the first connection portion 213 has at least two grooves 24 on the top surface thereof and the grooves 24 are filled by the plastic material to form a non-smooth structure. When moisture enters into the concave portion 31 along the interface between the second conducting portions 212 and the housing 3 (as shown FIG. 3), which is typically call "moisture-attack" issue, the non-smooth structure can reduce the degree of moisture attack and prevent the lighting device 10 from the moisture. The moisture-entering passage can be along the interface between the housing 3 and the first lead frame units 21, 22. For example, the interface between the housing 3 and the second conducting portions 212, 222 can have two kinds of moisture-entering passages, i.e., a horizontal moisture-entering passage "a1" and a vertical moisture-entering passage "a2", as shown in FIG. 2A. When moisture of environment enters the function zone (i.e., the exposed area of the first conducting portions 211, 221 for mounting lighting device 10 and wire-bonding) along the horizontal moisture-entering passage "a1", the non-smooth structure provides a longer, non-smooth, sinuous passage so that the moisture cannot easily enter into the function zone. On the other hand, when moisture of environment enters the function zone along the vertical moisture-entering passage "a2", the narrower necking portion of the first connection portion 213 (223) and the protruding portions 2115 (2215) are similarly providing a longer, non-smooth, sinuous passage so as to reduce the possibility that the moisture enters into the function zone. Furthermore, the plastic material can have concave-convex structures thereon, for example, the grooves 24 can have micro-convex structures on an inner surface thereof so that the curing plastic material has the concave-convex structures corresponding to the micro-convex structures of the grooves 24. Thus, the micro-convex structures further provide the horizontal moisture-entering passage "a1" to become as a longer moisture-entering passage for reducing the degree of the moisture entering into the function zone.

The protruding portions 2115 of the first lead frame unit 21 and the necking portion of the first connection portion 213 are covered by the housing 3. In other words, the protruding portions 2115 and the first connection portion 213 are embedded inside the housing 3. Therefore, the housing 3 cannot detach from the first conducting portion 211 which is exposed from the concave portion 31. The contact area between the plastic material (i.e., the housing 3) and the metal (i.e., the lead frame structure 2) are increased so that the combinability and the connection strength between the lead frame structure 2 and the housing 3 are improved after the plastic material is cured.

Moreover, the first conducting portions 211 and the first protruding body 214 construct a carrier with step-shaped structures therearound so that the soldering area defined by the bottom surface of the first conducting portions 211 is smaller than the wire-bonding area defined by the top surface of the first conducting portions 211. The different areas of the first conducting portions 211 are also provided for improving the combination strength between the plastic material and the metal and for elongating the moisture-entering passage. Specifically, a longitude moisture-entering passage "a3" is defined on the first connection portion 213 (223) as shown in FIG. 3. When moisture of environment enters into the function zone (i.e., the exposed area of the first conducting portions 211, 221 for mounting lighting device 10 and wire-bonding) along the longitude moisture-entering passage "a3", the step-shaped structures constructed by the first protruding body 214 (224) and the first conducting portions 211 (221) provide a longer, non-smooth passage so that the moisture cannot easily enter into the function zone and thus the "moisture-attack" issue can be reduced.

Accordingly, the necking portion and the at least two grooves 24 of the first connection portion 213 (223), the protruding portions 2115 of the first conducting portions 211 (221) and the step-shaped structures constructed by the first protruding body 214 (224) and the first conducting portions 211 (221) can be used to reduce the "moisture-attack" issue and further to improve the combination stability of the housing 3 and the first lead frame unit 21 (22).

Figure 4:
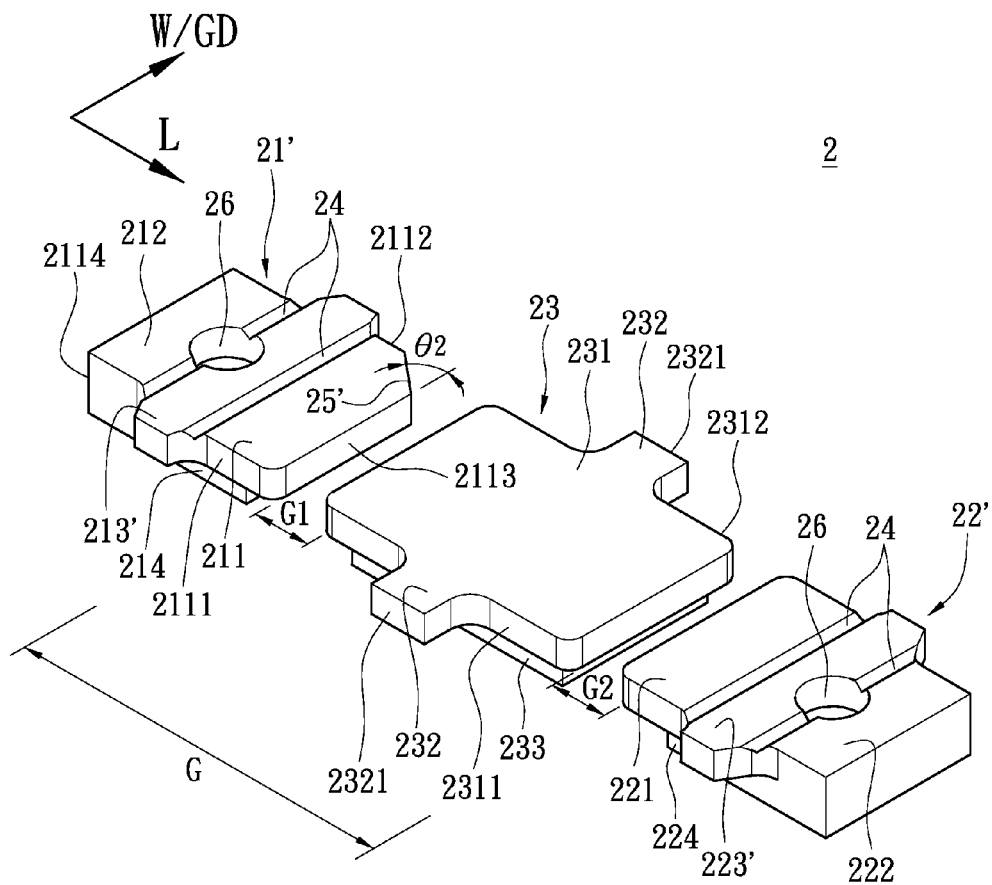
FIG. 4 is a top-view structural diagram of the second embodiment of the lead frame structure according to the present invention.

Please refer to FIG. 4; in which the top-view structural diagram of the lead frame structure 2 of the second exemplary embodiment is shown. The lead frame structure 2 of the second exemplary embodiment has a second lead frame unit 23 disposed in the gap G between the first lead frame units 21' and 22'. In addition, the second lead frame unit 23 is insulated from the first lead frame units 21' and 22' and define gaps G1 and G2 respectively with the first lead frame units 21' and 22'.

Similar with the first exemplary embodiment, the first lead frame unit 21' (22') has a first conducting portion 211 (221), a second conducting portion 212 (222), and a first connection portion 213' (223') connected between the first and the second conducting portions 211, 212 (221, 222). The first connection portion 213' (223') extends along the first direction L which is defined by the positions of the first conducting portion 211 (221) and the second conducting portion 212 (222). The first lead frame unit 21' (22') has at least two grooves 24 for reducing the moisture attack, and one groove 24 is formed on the connection position of the first conducting portion 211 (221) and the first connection portion 213' (223'), and the other groove 24 is formed on the connection position of the second conducting portion 212 (222) and the first connection portion 213' (223'). Furthermore, the width of the first connection portion 213' (223') is larger than the width of the first conducting portion 211 (221) and the width of the second conducting portion 212 (222).

Figure 5A:
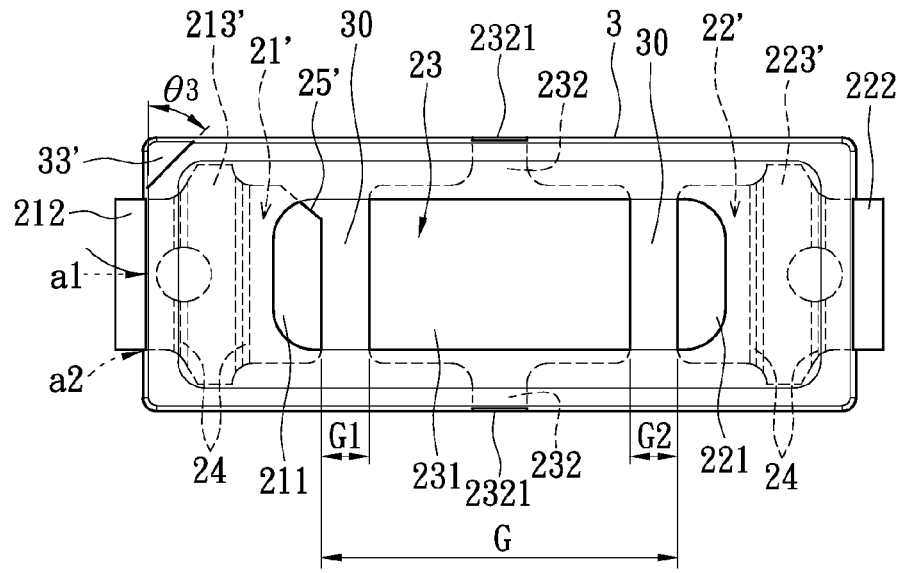
FIG. 5A is a top-view diagram of the second embodiment of the packaging structure according to the present invention.

The first lead frame unit 21' (22') of the second exemplary embodiment has smaller size than the first lead frame unit 21 (22) of the first exemplary embodiment. The area of the first conducting portion 211 (221) of the first lead frame unit 21' (22') of the second exemplary embodiment is enough to wire-bonding. The second lead frame unit 23 is used to mount the chip, i.e., the lighting device 10. Furthermore, the identification structure 25' is provided for differing and identifying the polarity of the two first lead frame units 21', 22'. Please refer to FIGS. 4 and 5A; the third side 2113 of the first lead frame units 21' is cut to form a chamfering as the identification structure 25', and an included angle θ2 is defined by the cut surface of the chamfering and the second direction GD, e.g., the second direction GD is parallel with the third direction W of this exemplary embodiment. The included angle θ2 is ranged from about 40 to 50 degrees, preferably about 45 degrees. In addition, the extended direction of the fourth side 2114 (2214) is substantially parallel to the extended direction of the third side 2113 (2213). The second direction GD is parallel with the third direction W in the second exemplary embodiment and the included angle θ2 is 0 (zero) degree. As shown in FIG. 5A, the housing 3 further has an auxiliary identification structure 33' which can be a tri-angle chamfering structure on a corner of the housing 3, but the shape of the chamfering structure is not restricted thereby. The position of the auxiliary identification structure 33' is corresponding to the position of the identification structure 25' so as to identify the polarity of the packaging structure of the present invention.

The first lead frame unit 21' (22') has a through hole 26 having a first hole portion with a smaller aperture and a second hole portion with a larger aperture. The first and the second hole portions are overlapped with each other, and the through hole 26 is called as a T-shaped hole. Due to the aperture difference of the first and the second hole portions, the inner wall of the through hole 26 has a stepped structure. When the plastic material is filled into the through hole 26, the cured plastic material can be locked and lodged with the inner wall of the through hole 26. The combination strength of the plastic material and the metal can be improved. In detail, the T-shaped hole is an inverted T-shaped structure, and the inverted T-shaped structure has an upper portion and a bottom portion. The upper portion has smaller size than the bottom portion. Because the plastic material is injected from the bottom of the packaging structure, the inverted T-shaped structure is provided for the fluidity and the formability of the injected plastic material. On the other hand, the inverted T-shaped structure is further provided for larger area of wire-bonding of the first lead frame unit 21' (22'). Alternatively, the through hole 26 can be formed as an I-shaped structure with two end portions having larger aperture than the middle portion of the I-shaped structure.

The second lead frame unit 23 has a conducting body 231, and the bottom of the conducting body 231 has a second protruding body 233 integrally thereon to construct a carrier with step-shaped structures therearound so that soldering area defined by the bottom surface of the second lead frame unit 23 is smaller than the wire-bonding area defined by the top surface of the second lead frame unit 23. Moreover, the second protruding body 233 has a surface exposed from a bottom surface of the housing 3, and the surface of the second protruding body 233 and the bottom surface of the housing 3 form a coplanar surface. In other words, the step-shaped structures provide for a planar surface formed of a bottom surface of the second lead frame unit 23 and a bottom surface of the housing 3.

Similar with the definition of the first direction L of the first embodiment, the second lead frame unit 23 has two sides i.e., the fifth side 2311 and the sixth side 2312 extending along the first direction L. In other words, the fifth and the sixth sides 2311, 2312 of the second lead frame unit 23 are substantially parallel with the first direction L. The fifth and the sixth sides 2311, 2312 of the second lead frame unit 23 respectively extend outward to form a second protruding portion 232 which can support the plastic material after the plastic material is injected into the mold.

Figure 5B:
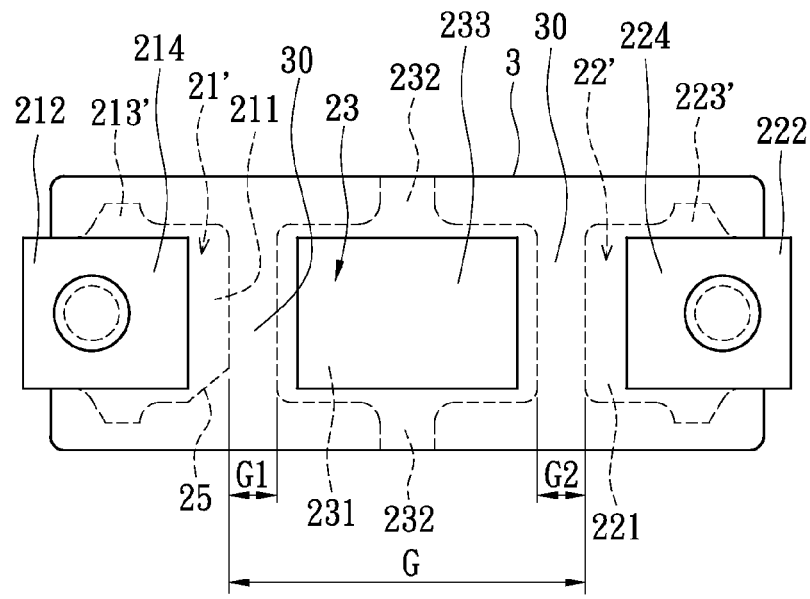
FIG. 5B is a bottom-view diagram of the second embodiment of the packaging structure according to the present invention.

Please refer to FIGS. 5A and 5 B; the first lead frame units 21', 22' are arranged in the manner of facing the first conducting portions 211, 221 to each other. The second lead frame unit 23 is disposed between the first lead frame units 21', 22'. The first lead frame units 21', 22' and the second lead frame unit 23 are arranged in the above-mentioned arrangement and then be put into a mold. The plastic material is filled into the mold to cover the lead frame structure 2 to form a housing 3 thereon. A division 30 is formed between the adjacent lead frame units and the second conducting portions 212, 222 partially exposed from the housing 3. The first conducting portion 211 (221) of the first lead frame units 21', (22'), the first connection portion 213' (223'), and the conducting body 231 of the second lead frame unit 23 are disposed in the housing 3. In the exemplary embodiment, the housing 3 has two divisions 30 formed by filling the plastic material into the gaps G1, G2 and further has a concave portion 31. The first conducting portion 211 (221) of the first lead frame unit 21', (22'), the first connection portion 213' (223'), and the conducting body 231 of the second lead frame unit 23 are partially exposed from the concave portion 31. The first conducting portion 211, 221 and the conducting body 231 are separated and insulated from each other by the two divisions 30. On the other hand, the surface of the first protruding body 214 (224) and the surface of the second protruding body 233 are exposed from a bottom surface of the housing 3. The surface of the first protruding body 214 (224), the surface of the second protruding body 233 and the bottom surface of the housing construct a substantially coplanar surface.

Taking the first lead frame units 21' as the example, the first connection portion 213' has at least two grooves 24 on a surface thereof. For the horizontal moisture-entering passage "a1" of the second conducting portions 212 (222), when moisture of environment enters the packaging structure through the second conducting portions 212 (222) exposed from the housing 3, the non-smooth structure formed by filling the plastic material into the grooves 24 can reduce the moisture-attack. In addition, a pillar structure formed by filling the plastic material into the through hole 26 can applied to decrease the surface area of horizontal moisture-attack. When moisture of environment enters the housing 3 along the vertical moisture-entering passage "a2" of the second conducting portions 212 (222), the larger portion of the first connection portion 213' (223') is similarly providing a longer, non-smooth, sinuous passage so as to reduce the entering of moisture.

Figure 6:
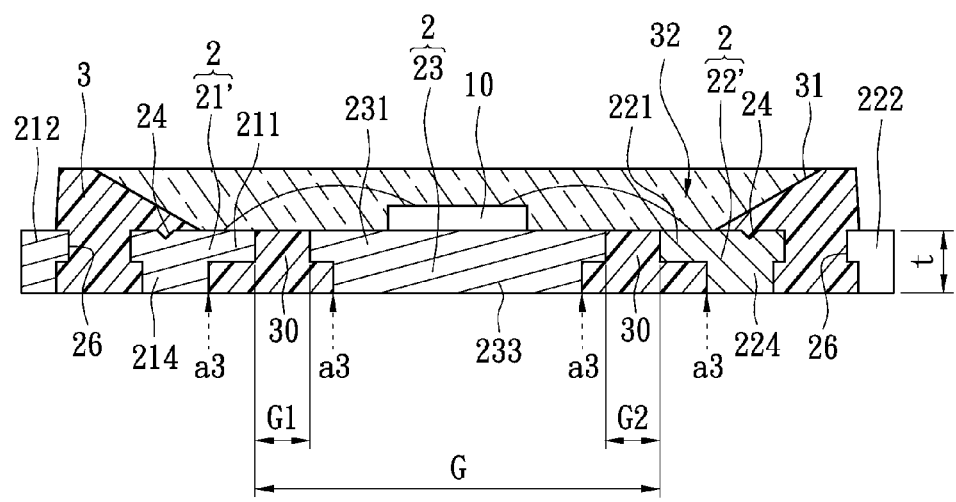
FIG. 6 is a cut-view diagram of the second embodiment of the lighting unit according to the present invention.

As shown in FIG. 6, when moisture of environment enters the function zone (i.e., the conducting body 231 and the first conducting portions 211, 221 for mounting lighting device 10 and wire-bonding) along the longitude moisture-entering passage "a3" which is defined by the interface between the housing 3 and the protruding bodies 233, 214, 224, the step-shaped structures of the first lead frame units 21', 22' and the second lead frame unit 23 provide a longer, non-smooth passage so that the moisture cannot easily enter into the function zone and thus the "moisture-attack" issue can be reduced. Furthermore, the combination strength of the housing 3 of plastic material and the lead frame structure of metal can be improved.

The second protruding portion 232 of the conducting body 231 of the second lead frame unit 23 has a thinner thickness than the traditional lead frame unit so that the stress residual on the second protruding portion 232 after machining can be reduced. As the residual stress is decreased, the second protruding portion 232 made of metal and the housing 3 made of the plastic material are connected firmly and without "gap" therebetween. After the plastic material is cured, the second protruding portion 232 has a cross-section surface 2321 which is exposed from the housing 3. The second protruding portion 232 can be used to support the plastic material. Moreover, the second protruding portion 232 may have grooves thereon, which is similar with the grooves 24 formed on the first connection portion 213, to reduce the moisture-attack issue.

FIG. 6 shows a cut-view of a lighting unit. The lighting device 10 is mounted on the second lead frame unit 23 and is electrically connected to the first lead frame units 21', 22' to form a heat/electricity-separated unit. In other words, the lead frame units of the present invention such as the first lead frame units 21', 22' and the second lead frame unit 23, can respectively be a thermal-conducting or electric-conducting lead frame unit. Specifically, the lighting device is mounted on the conducting body 231 of the second lead frame unit 23 which is exposed from the concave portion 31 of the housing 3, and the second lead frame unit 23 is used for dissipating the heat generated from the lighting device 10. On the other hand, the lighting device 10 is electrically connected to the first conducting portions 211, 221 of the first lead frame units 21', 22' by wire bonding, and the second conducting portions 212, 222 are connected to an external power supply so as to power the lighting device 10 to generate lights.

Figure 7:
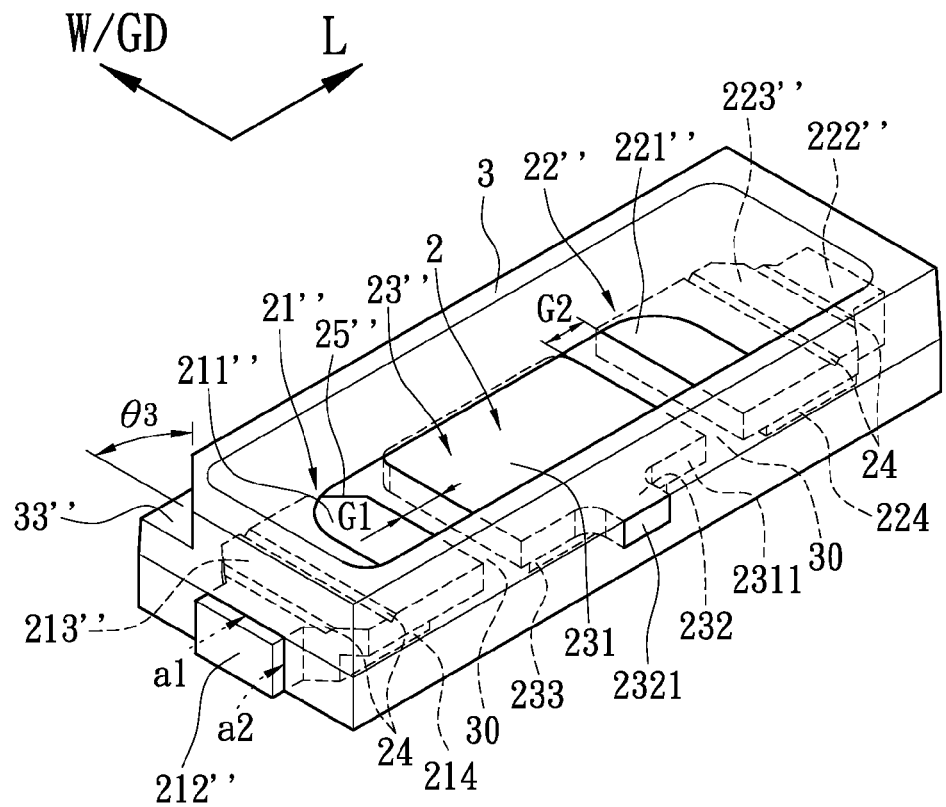
FIG. 7 is a perspective diagram of the third embodiment of the packaging structure according to the present invention.
Figure 8:
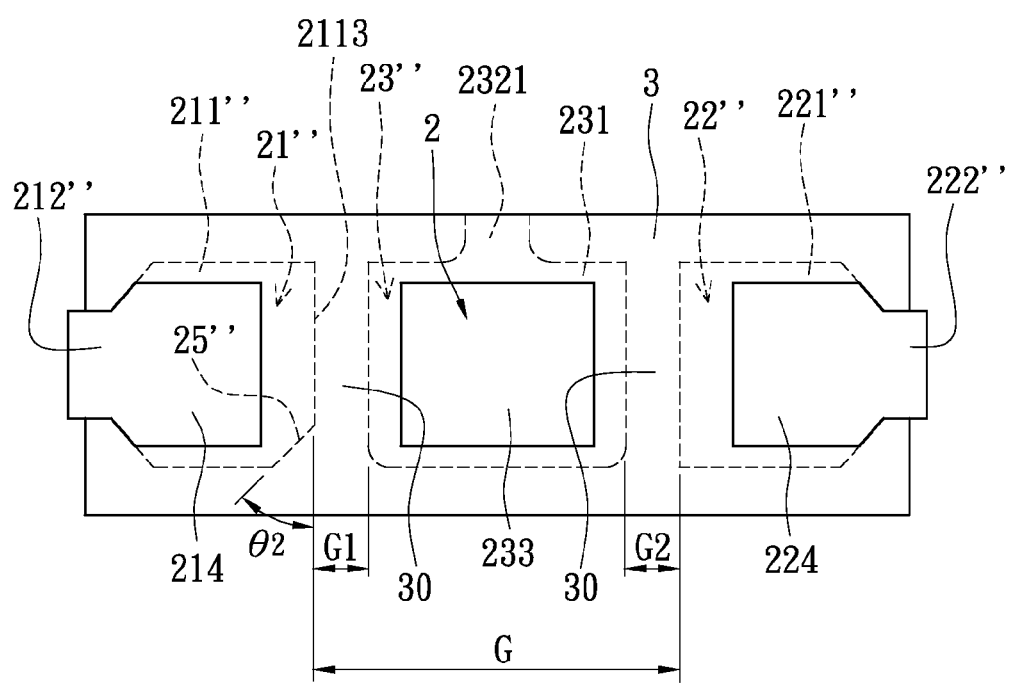
FIG. 8 is a bottom-view diagram of the third embodiment of the packaging structure according to the present invention.

FIGS. 7 and 8 respectively show the perspective view and bottom view of the packaging structure which is formed by covering the plastic material on the lead frame structure 2 of the third embodiment. Differing from the second embodiment, the first lead frame units 21", 22" has no through hole thereon. Furthermore, the second lead frame unit 23 simply has one second protruding portion 232 on one side thereof, i.e., the fifth side 2311. Similar to the foregoing embodiment, the at least two grooves 24 and the step-shaped structure are used for disturbing the moisture-entering passage and for preventing the lighting device 10 from the moisture. Furthermore, the at least two grooves 24 and the step-shaped structure can be used for improving the combination strength of the metal lead frame unit and the plastic housing 3. The triangle auxiliary identification structure 33" formed on a corner of the housing 3 corresponds to the identification structure 25" formed on the third side 2113 of the first lead frame unit 21", for example, the auxiliary identification structure 33" and the identification structure 25" are formed on the same side of the unit. As a result, the auxiliary identification structure 33" and the identification structure 25" provide an identification function to identify the polarity during manufacturing products. Moreover, a width of the second conducting portion 212" (222") is smaller than the width of the first conducting portion 213" (223") and the width of the first connection portion 211" (221") to decrease the exposed area of the second conducting portion 212" (222") exposed from the housing 3. Thus, the interface area of the second conducting portion 212" (222") and the housing 3 is reduced so that it is difficult for the moisture entering into the function zone along the interface between the second conducting portion 212" (222") and the housing 3.

In the first embodiment, the lead frame structure 2 has two first lead frame units 21, 22 and there is a gap G between the two first lead frame units 21, 22. The first lead frame unit 21 (22) has a first protruding body 214 (224). In the second and the third embodiments, the lead frame structure 2 has two opposite arranged first lead frame units 21', 22' and a second lead frame unit 23 disposed in the gap G between the first lead frame units 21' and 22'. The second lead frame unit 23 is insulated from the first lead frame units 21' and 22' and define gaps G1 and G2 respectively with the first lead frame units 21' and 22'. The first lead frame units 21' and 22' respectively have first protruding body 214, 224, and the second lead frame unit 23 has the second protruding body 233. The protruding bodies 214, 224, 233 and the material thickness are determined with a predetermined ratio. Please refer to FIGS. 3 and 6; the thickness of the protruding bodies 214, 224, 233 is 0.1 to 0.5 times of the thickness "t" of the carrier. In other words, the maximum thickness of the protruding bodies 214, 224, 233 is half of the thickness "t" of the carrier. In an exemplary embodiment, the thickness "t" of the carrier is about 0.8 mm, and the thickness of the protruding bodies 214, 224, 233 and the thickness of the connection portions 211, 221, 231 are respectively about 0.4 mm. Because moisture propagates along the interface between the plastic material and the metal, the step-shaped structures provide a longer, non-smooth passage so as to reduce the "moisture-attack".

On the other hand, the groove 24 of the exemplary embodiment is a V-shaped groove and the depth of the grooves is ranged about form 0.03 to 0.05 mm. The opening angle defined by the two side surfaces of the V-shaped groove is ranged about 60 to 120 degrees, preferably about 90 degrees.

At least one of the lead frame units has an identification structure 25 to differ the two end units in appearance or in structure so as to identify the polarity after mounting the lighting device 10. As a result, the effect of mistake proofing is achieved due to the identification function provided by the identification structure 25. Thus, the step of wire-bonding is efficiently performed so as to reduce the manufacturing time and cost, and further to improve the economic profit. In addition, the identification structure 25 is helpful for the automatic manufacturing technique.

In general, the housing 3, the lead frame structure 2 partially covered by the housing 3 and the lighting device 10 are constructed as a lighting unit. The housing 3 is formed by filling the plastic material into the mold to cover the lead frame structure 2 and to stuff the gap between the adjacent lead frame units. In the case that the lead frame structure 2 has N+1 lead frame units, the plastic material is filled into the adjacent lead frame units to form N divisions wherein N is equal to or larger than 1 (one). Therefore, the lead frame units are insulated from each other. Each lead frame unit has two end portions (i.e., the conducting portions 211, 212) and a connection portion between the two end portions (i.e., the connection portion 213). The housing 3 further has a concave portion 31 and at least one of the two end portions is partially exposed from the concave portion 31. One of the lead frame units is used for mounting the lighting device 10 thereon, and the lighting device 10 is electrically connected to another lead frame unit by conducting the wire, such as wire-bonding. Moreover, the connection portion of the lead frame unit has at least two grooves 24 which are covered by the housing 3. The grooves 24 are filled by the plastic material to from a non-smooth structure to increase the length of moisture attack passage and prevent the lighting device 10 from the moisture.

When the above-mentioned "N" equals to 1(one), the first embodiment of the present invention is shown. In other words, the housing 3 has one division 30, and the lead frame structure 2 has two lead frame units (e.g., the first lead frame units 21, 22) which arrange along the first direction L. The division 30 is formed between the two lead frame units, and the lead frame units are partially exposed from the concave portion 31, as shown in FIG. 1, the first conducting portions 211, 221 are exposed in the concave portion 31.

As shown in FIGS. 6 and 7, the second and the third embodiment of that the above-mentioned "N" equals to 2(two) are represented. The housing 3 has two divisions 30, and the lead frame structure 2 has three lead frame units (e.g., the first lead frame units 21 (21'), 22 (22') and the second lead frame unit 23 (23')) which arrange along the first direction L. one of the divisions 30 is formed between the adjacent lead frame units. In the embodiment, the middle lead frame unit (i.e., the second lead frame unit 23) is used for mounting lighting device 10 and dissipating heat.

On the other hand, the lead frame units provide function of conduction of heat or electricity.

In addition, an encapsulation member 32 covers the lighting device 10. Specifically, the encapsulation member 32 is filled into the concave portion 31 to cover the lighting device 10 and the exposed area of the lead frame units, such as connection portions 211, 221 and the conducting body 231.

Preferably, the inner surface of the concave portion 31 has effects of reflection, for example, a reflection layer is disposed on the inner surface of the concave portion 31 in order to achieve the better effect of light emitting.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A lead flame structure, comprising:
   at least two first lead flame units separated from each other by a gap,
   each of the first lead flame units having:
      a first conducting portion, a second conducting portion, and a first connection portion between the first conducting portion and the second conducting portion,
      at least two grooves formed on a surface of the first connection portion;
      wherein position of the first conducting portion and position of the second conducting portion define a first direction, the first direction is non-parallel to a direction of the gap, the first conducting portion has a first side and a second side along the first direction, the first conducting portion further has a third side parallel to the direction of the gap, and
   the third side of one of the at least two first frame units has an identification structure so that the at least two first lead flame units have a difference in appearance for identifying the at least two first lead flame units.

2. The lead flame structure according to claim 1, wherein the first connection portion of each of the at least two first lead frame units extends along the first direction for connecting the first conducting portion and the second conducting portion, a width of the first connection portion is smaller than a width of the first conducting portion and a width of the second conducting portion.

3. The lead frame structure according to claim 1, wherein each of the at least two first lead frame units further including:
   a through hole between the first connection portion and the second conducting portion, the through hole has a first hole portion and a second hole portion overlapped with each other, an aperture of the second hole portion is larger than an aperture of the first hole portion;
   wherein the first connection portion extends along the first direction for connecting the first conducting portion and the second conducting portion, a width of the first connection portion is larger than a width of the first conducting portion and a width of the second conducting portion.

4. The lead frame structure according to claim 1, wherein the first connection portion of each of the at least two first lead frame units extends along the first direction for connecting the first conducting portion and the second conducting portion, a width of the second conducting portion is smaller than a width of the first conducting portion and a width of the first connection portion.

5. The lead frame structure according to claim 1, further comprising:
   a second lead frame unit disposed in the gap and isolated from the at least two first lead frame units, and
   wherein the second lead frame unit including a conducting body and a second protruding body integrally on a bottom of the conducting body for constructing a step-shaped structure.

6. The lead frame structure according to claim 5, wherein each of the at least two first lead frame units further comprising:
   a through hole between the first connection portion and the second conducting portion, the through hole has a first hole portion and a second hole portion overlapped with each other, an aperture of the second hole portion is larger than an aperture of the first hole portion;
   wherein the first connection portion extends along the first direction for connecting the first conducting portion and the second conducting portion, a width of the first connection portion is larger than a width of the first conducting portion and a width of the second conducting portion.

7. The lead frame structure according to claim 5, wherein the first connection portion of each of the at least two first lead frame units extends along the first direction for connecting the first conducting portion and the second conducting portion, a width of the second conducting portion is smaller than a width of the first conducting portion and a width of the first connection portion.

8. The lead frame structure according to claim 1, wherein each of the at least two first lead frame units further including:
   a first protruding body extending from a bottom of the first conducting portion to the first direction for constructing a step-shaped structure.

9. The lead flame structure according to claim 1, wherein each of the at least two first lead frame units further including:
   a first protruding portion integrally on a bottom of the first conducting portion.

10. The lead flame structure according to claims 1, wherein one of the at least two grooves is formed on a connection position of the first conducting portion and the first connection portion, and the other one of the at least two grooves is formed on a connection position of the second conducting portion and the first connection portion.

11. A packaging structure, comprising:
    a housing having at least one division;
    a lead frame structure having a pair of first lead frame units isolated from each other by the division, and wherein a bottom surface of the lead frame is exposed from the housing;
    each of the pair of first lead frame units having:
       a first conducting portion disposed in the housing,
       a second conducting portion, and
       a first connection portion disposed between the first conducting portion and the second conducting portion,
       at least two grooves on a top surface of the first connection portion and being covered by the housing, and
       wherein the second conducting portion is partially exposed from the housing,
    wherein the first conducting portion of one of the pair of first lead frame units has an identification structure so that the pair of first lead frame units have a difference in appearance for identifying the pair of first lead frame units.

12. The packaging structure according to claim 11, each of the pair of first lead frame units further including:
    a through hole between the first connection portion and the second connection portion;
    wherein the first connection portion connects the first conducting portion and the second conducting portion, and
    wherein the through hole has a first hole portion and a second hole portion overlapped with each other, an aperture of the second hole portion is larger than an aperture of the first hole portion, and the housing extends into the through hole.

13. The packaging structure according to claim 11, wherein position of the first conducting portion and position of the second conducting portion of each of the pair of first lead frame units define a first direction, the first connection portion extends along the first direction for connecting the first conducting portion and the second conducting portion, and a width of the second conducting portion is smaller than a width of the first conducting portion and a width of the first connection portion.

14. The packaging structure according to claim 11, the lead frame structure further comprising:
a second lead frame unit disposed between the pair of first lead frame units and isolated from the pair of first lead frame units;
wherein the second lead frame unit is constructed of a step-shaped structure so as to provide for a planar surface formed of a bottom surface of the second lead frame unit and a bottom surface of the housing;
wherein the housing has a concave portion; and
wherein the first conducting portion of each of the pair of first lead frame units and the second lead frame unit are partially exposed from the concave portion.

15. The packaging structure according to claim 14, each of the pair of first lead frame units further comprising:
a through hole between the first connection portion and the second conducting portion;
wherein the first connection portion connects the first conducting portion and the second conducting portion,
wherein the through hole has a first hole portion and a second hole portion overlapped with each other, an aperture of the second hole portion is larger than an aperture of the first hole portion, and
wherein the housing extends into the through hole.

16. The packaging structure according to claim 14, wherein the first connection portion of each of the pair of first lead frame units connects the first conducting portion and the second conducting portion, and a width of the second conducting portion is smaller than a width of the first conducting portion and a width of the first connection portion.

17. The packaging structure according to claim 11, wherein the first conducting portion of each of the pair of first lead frame units is constructed of a step-shaped structure so as to provide for a planar surface formed of a bottom surface of the pair of first lead frame units and a bottom surface of the housing; and
wherein the housing has a concave portion, and wherein the first conducting portion of each of the pair of first lead frame units is partially exposed from the concave portion.

18. The packaging structure according to claim 11, wherein each of the pair of first lead frame units further including:
a first protruding portion integrally on a bottom of the first conducting portion, the first protruding portion is covered by the housing.

19. A lighting unit, comprising:
a housing having N divisions and a concave portion, wherein N is equal to or larger than one;
a lead frame structure covered by the housing, the lead frame structure including N+1 lead frame units, each one of the lead frame units is isolated from an adjacent one of the lead frame units by one of the divisions, wherein
each of the lead frame units including:
a first conducting portion, a second conducting portion, and a connection portion between the first conducting portion and the second conducting portion, one of the first conducting portion and the second conducting portion is partially exposed from the concave portion,
at least two grooves formed on a top surface of the connection portion and covered by the housing, and
wherein the one of the first conducting portion and the second conducting portion of one of the lead frame units has an identification structure so that the lead frame units have a difference in appearance for identifying the lead frame units;
at least one lighting device disposed in the concave portion and on one of the lead frame units and electrically connected to the rest of the lead frame units;
an encapsulation member disposed in the concave portion and covered the at least one lighting device and the one of the first conducting portion and the second conducting portion of each of the lead frame units.

20. The lighting unit according to claim 19, wherein each of the lead frame units further including:
a through hole between the first connection portion and the other one of the first conducting portion and the second conducting portion,
the through hole has a first hole portion and a second hole portion overlapped with each other,
an aperture of the second hole portion is larger than an aperture of the first hole portion, and
wherein the housing extends into the through hole.

21. The lighting unit according to claim 19, wherein position of the first conducting portion and position of the second conducting portion of each of the lead frame structures define a first direction, the connection portion extends along the first direction for connecting the first conducting portion and the second conducting portion, and a width of the one of the first conducting portion and the second conducting portion is larger than a width of the other one of the first conducting and the second conducting portion and a width of the connection portion.

22. The lighting unit according to claim 19, wherein each of the lead frame units is constructed of a step-shaped structure so as to provide for a planar surface formed of a bottom surface of the lead frame structure and a bottom surface of the housing.

* * * * *